US009530419B2

(12) United States Patent
Vilermo et al.

(10) Patent No.: US 9,530,419 B2
(45) Date of Patent: Dec. 27, 2016

(54) ENCODING OF STEREOPHONIC SIGNALS

(75) Inventors: Miikka Tapani Vilermo, Siuro (FI); Lasse Juhani Laaksonen, Nokia (FI)

(73) Assignee: Nokia Technologies Oy, Espoo (FI)

( * ) Notice: Subject to any disclaimer, the term of this patent is extended or adjusted under 35 U.S.C. 154(b) by 250 days.

(21) Appl. No.: 14/115,178

(22) PCT Filed: May 4, 2011

(86) PCT No.: PCT/IB2011/051975
§ 371 (c)(1),
(2), (4) Date: Nov. 1, 2013

(87) PCT Pub. No.: WO2012/150482
PCT Pub. Date: Nov. 8, 2012

(65) Prior Publication Data

US 2014/0074488 A1 Mar. 13, 2014

(51) Int. Cl.

| | |
|---|---|
| ***H04N 7/167*** | (2011.01) |
| ***H04B 1/66*** | (2006.01) |
| ***H04R 5/00*** | (2006.01) |
| ***H04R 29/00*** | (2006.01) |
| ***H04B 3/20*** | (2006.01) |
| ***H03G 5/00*** | (2006.01) |

(Continued)

(52) U.S. Cl.
CPC ............ *G10L 19/00* (2013.01); *G10L 19/008* (2013.01); *H04S 1/007* (2013.01); *G10L 19/032* (2013.01); *H04S 2420/03* (2013.01)

(58) Field of Classification Search
CPC ... H05K 999/99; H04B 1/665; G10L 19/0212; G10L 19/12; G10L 19/008; G10L 21/0208; G10L 21/04; H04S 3/02; H04S 3/00; H04S 1/002; H04N 11/00; H04M 9/082; H04R 5/02; H04R 3/04; H04R 3/14; H03G 3/001; G10K 11/175; H04H 20/88
USPC .... 704/200, 230, 500, 206, 200.1, 203, 226, 704/205, 222, 227, 211, 223; 381/22, 23, 381/56, 66, 104, 17, 99, 300, 73.1, 2, 98, 381/27, 20
See application file for complete search history.

(56) References Cited

U.S. PATENT DOCUMENTS

| | | | | |
|---|---|---|---|---|
| 5,625,745 A * | 4/1997 | Dorward | H04B 1/665 | 381/2 |
| 6,529,604 B1 * | 3/2003 | Park | H04H 20/88 | 381/22 |

(Continued)

FOREIGN PATENT DOCUMENTS

| | | | |
|---|---|---|---|
| EP | 0559383 | A1 | 9/1993 |
| WO | 2010/105926 | A2 | 9/2010 |

OTHER PUBLICATIONS

Herre et al., "Combined Stereo Coding", Digital Signal Processing, Audio Engineering Society, Paper No. 3369 (D-6), Oct. 1, 1992, 19 Pages.

(Continued)

*Primary Examiner* — Pierre-Louis Desir
*Assistant Examiner* — Anne Thomas-Homescu
(74) *Attorney, Agent, or Firm* — Alston & Bird LLP

(57) ABSTRACT

A stereophonic signal is converted into a mid channel signal and a side channel signal. Noise is added to the side channel signal. The amount of noise is selected depending on masking thresholds for at least two channels of the stereophonic signal. The mid channel signal and the modified side channel signal are quantized for transmission. Alternatively or in addition, a set of quantization parameter for the quantization of the side channel signal is selected depending on the masking thresholds.

20 Claims, 6 Drawing Sheets

(51) Int. Cl.

| | |
|---|---|
| ***H04H 20/47*** | (2008.01) |
| ***H03G 3/00*** | (2006.01) |
| ***H04R 5/02*** | (2006.01) |
| ***G10L 19/00*** | (2013.01) |
| ***G10L 21/00*** | (2013.01) |
| ***G10L 19/02*** | (2013.01) |
| ***G10L 19/008*** | (2013.01) |
| ***H04S 1/00*** | (2006.01) |
| *G10L 19/12* | (2013.01) |
| *G10L 21/02* | (2013.01) |
| *G10L 25/90* | (2013.01) |
| *G10L 19/032* | (2013.01) |

(56) References Cited

U.S. PATENT DOCUMENTS 7,203,641 B2 * 4/2007 Tasaki ..................... G10L 19/12 704/223
2003/0115051 A1 * 6/2003 Chen ..................... G10L 19/008 704/230
2004/0170290 A1 9/2004 Chang et al.
2005/0271367 A1 * 12/2005 Lee ..................... G10L 21/0364 386/239
2006/0074693 A1 * 4/2006 Yamashita ............ G10L 19/032 704/500
2006/0153392 A1 * 7/2006 Kim ...................... G10L 19/008 381/23
2006/0158356 A1 * 7/2006 Kim ...................... G10L 19/008 341/51
2007/0239295 A1 * 10/2007 Thompson ............ G10L 19/008 700/94
2007/0297616 A1 * 12/2007 Plogsties ................. H04S 3/004 381/23
2008/0008327 A1 * 1/2008 Ojala ........................ H04S 3/02 381/20
2008/0130903 A1 6/2008 Ojanpera
2009/0022328 A1 * 1/2009 Neugebauer ............ H04S 1/005 381/27
2009/0041255 A1 * 2/2009 Goto ..................... G10L 19/008 381/17
2009/0136066 A1 * 5/2009 Johnston ................. H04S 1/007 381/300
2010/0094637 A1 4/2010 Vinton
2010/0217586 A1 * 8/2010 Shimada ............. G10L 21/0272 704/226
2010/0305727 A1 * 12/2010 Ojanpera .............. G10L 19/008 700/94
2011/0046946 A1 * 2/2011 Liu ......................... G10L 19/24 704/203
2011/0170711 A1 * 7/2011 Rettelbach .............. G10L 19/02 381/98
2011/0282674 A1 * 11/2011 Ojanpera ................ H04S 3/008 704/500
2012/0195435 A1 * 8/2012 Ojanpera .............. G10L 19/008 381/17
2013/0028426 A1 * 1/2013 Purnhagen ............ G10L 19/008 381/22
2013/0253938 A1 * 9/2013 You ....................... G10L 19/008 704/500

OTHER PUBLICATIONS

"Frame Error Robust Narrow-Band and Wideband Embedded Variable Bit-Rate Coding of Speech and Audio From 8-32 Kbit/s", Series G: Transmission Systems and Media, Digital Systems and Networks, Digital terminal equipments—Coding of voice and audio Signals, ITU-T Recommendation G.718, Jun. 2008, 257 Pages.
"G.729-Based Embedded Variable Bit-Rate Coder: An 8-32 Kbit/s Scalable Wideband Coder Bitstream Interoperable With G.729", Series G: Transmission Systems and Media, Digital Systems and Networks, Digital terminal equipments—Coding of analogue signals by methods other than PCM, ITU-T Recommendation G.729.1, May 2006, 100 Pages.
Johnston, "Transform Coding of Audio Signals Using Perceptual Noise Criteria", IEEE Journal on Selected Areas in Communications, vol. 6, Issue 2, Feb. 1988, pp. 314-323.
Extended European Search Report received for corresponding European Patent Application No. 11864783.3, dated Sep. 2, 2014, 8 pages.
Derrien et al., "A New Model-Based Algorithm for Optimizing The MPEG-AAC in MS-Stereo", IEEE Transactions on Audio, Speech, and Language Processing, vol. 16, No. 8, Nov. 2008, pp. 1373-1382.
Zwislocki, "A Theory of Central Auditory Masking and Its Partial Validation", The Journal of the Acoustical Society of America, Jul. 1972, pp. 644-659.
International Search Report and Written Opinion received for corresponding Patent Cooperation Treaty Application No. PCT/IB2011/051975, dated Feb. 15, 2012, 14 pages.
Verhelst W. et al. "least squares theory and design of optimal noise shaping filters", AES 22nd Int. Conf. on Virtual, Synthetic and Entertainment Audiio, Jun. 15-17, 2002, Espoo, Finland 7 pages.
Herre, J. "From joint stereo to spatial audiio coding: recent progress and standardization", Int. Conf. on Digistal Audio Effects (DAFx'04), Naples, Italy, Oct. 5-8, 2004, pp. 157-162.

* cited by examiner

ENCODING OF STEREOPHONIC SIGNALS

RELATED APPLICATION

This application was originally filed as PCT Application No. PCT/IB2011/051975 filed May 4, 2011.

FIELD OF THE DISCLOSURE

The invention relates to the field of audio coding, and more specifically to a combined encoding of stereophonic signals.

BACKGROUND

Audio signals, like music or speech, are encoded for example for enabling an efficient transmission or storage of the audio signals. The audio signals may be mono signals using a single channel or stereophonic signals using two or more channels. The latter are also referred to as stereo audio signals or multichannel audio signals.

Stereophonic signals have mostly replaced mono audio signals in television, radio, internet audio, video streaming and clips etc. The same transformation may be expected in speech communication.

A stereophonic signal may be encoded by encoding each channel separately or by using a combined encoding. In both cases, the encoding typically includes a quantization.

An exemplary separate encoding can be for instance an L/R coding, which includes a separate coding of a left (L) channel signal and of a right (R) channel signal of a two-channel stereo signal.

An exemplary combined coding is a mid channel and side channel (M/S) coding. For M/S coding, a mono downmix mid (M) channel signal is created as a mixture of a left channel signal and a right channel signal of a stereo input signal. In addition, a side (S) channel signal is created as a different mixture of the left and right channel signals. A receiver may then reconstruct the left and right channel signals from the mid and side channel signals.

An encoder may also be designed to choose between L/R and M/S coding depending on the signal characteristics of a respective stereophonic signal. Firstly, the signal may be divided into short blocks in the time domain. The blocks may have a length of 5-50 ms and they may overlap. Secondly, the blocks may be transformed into the frequency domain using a short time Fourier transform (STFT) or any other kind of transform. In the frequency domain, the switch between L/R and M/S coding may then be performed independently for different frequency bands. There may be for instance approximately 50 frequency bands.

Typically, M/S channel coding is only selected when the left and right channel signals are strongly correlated, that is, if left and right channel signals are very similar. In this case, M/S coding concentrates most of the total energy to the mid channel signal, leaving little energy to the side channel signal. Source coding such mid and side channel signals requires fewer bits than source coding the corresponding left and right channel signals.

Moreover, if left and right channel signals are strongly correlated, the audio signal is perceived to be coming from a direction between left and right channels. Since left and right channel signals are correlated, the mid channel signal has more energy than the side channel signal and the quantization error of the mid channel signal usually dominates over the quantization error from the side channel signal. After conversion back to left and right channel signals, the larger quantization error from the mid channel signal will dominate over the quantization error from the side channel signal. The quantization error from the mid channel signal will be distributed to the reconstructed left and right channels so that the quantization error is approximately the same in left and right channels. The quantization error will not be exactly the same, because the side channel signal usually has a small nonzero quantization error, and the contribution of the left and right channels to mid and side channel signals might have been selected not to be exactly equivalent. Still, the quantization error after M/S coding will correlate in the reconstructed left and right channel signals. Thus, the quantization error will be perceived to be coming from the same direction as the audio signal. Therefore, the audio signal masks the quantization error better with M/S coding than with a separate coding of left and right channel signals.

L/R coding may be selected when the left and right channel signals are uncorrelated. L/R encoding of uncorrelated left and right channel signals may require less bits that M/S coding. Furthermore, using M/S encoding with uncorrelated left and right channel signals may lead to situations in which the quantization error will be perceived as coming from a different direction than the audio signal in a stereo image. This may make the resulting quantization noise more audible than a quantization noise that is perceived to come from the same direction as the audio signal as in the case of L/R coding.

SUMMARY OF SOME EMBODIMENTS OF THE INVENTION

An embodiment of a method according a first aspect of the invention comprises determining a respective masking threshold for at least two channels of a stereophonic signal. The method further comprises determining an amount of noise in response to a difference between the determined masking thresholds for the at least two channels. The method further comprises adding the determined amount of noise to a side channel signal, wherein the side channel signal has been obtained by converting the stereophonic signal at least into a mid channel signal and the side channel signal. The method further comprises quantizing the mid channel signal and the side channel signal for transmission.

An embodiment of a method according a second aspect of the invention comprises determining a respective masking threshold for at least two channels of a stereophonic signal. The method further comprises determining for each of different combinations of values of a plurality of quantization parameters used in a quantization of a side channel signal either an average of a quantization noise exceeding a masking threshold for the at least two channels of the stereophonic signal or a maximum of a quantization noise exceeding a masking threshold for the at least two channels of the stereophonic signal, wherein the side channel signal has been obtained by converting the stereophonic signal at least into a mid channel signal and the side channel signal. The method further comprises selecting the combination of values of the plurality of quantization parameters resulting in the minimum of the determined averages or the minimum of the determined maxima, respectively. The method further comprises quantizing the mid channel signal and the side channel signal for transmission using the determined combination of values of quantization parameters.

A masking threshold indicates an amount of noise that may be added to an audio signal without being audible in the audio signal. The masking threshold can be determined by means of a psychoacoustic model for each channel of a stereophonic signal as a whole or separately for respective time blocks and/or frequency bands of each channel of the stereophonic signal.

A first embodiment of an apparatus according the first aspect of the invention comprises one or more means for realizing the actions of the embodiment of the method presented for the first aspect of the invention. A first embodiment of an apparatus according the second aspect of the invention comprises one or more means for realizing the actions of the embodiment of the method presented for the second aspect of the invention.

The means of these embodiments of an apparatus can be implemented in hardware and/or software. They may comprise for instance a processor for executing computer program code for realizing the required functions, a memory storing the program code, or both. Alternatively, they could comprise for instance circuitry that is designed to realize the required functions, for instance implemented in a chipset or a chip, like an integrated circuit.

A second embodiment of an apparatus according the first aspect of the invention comprises at least one processor and at least one memory including computer program code, the at least one memory and the computer program code configured to cause an apparatus at least to perform the actions of the embodiment of the method presented for the first aspect of the invention. A second embodiment of an apparatus according the second aspect of the invention comprises at least one processor and at least one memory including computer program code, the at least one memory and the computer program code configured to cause an apparatus at least to perform the actions of the embodiment of the method presented for the second aspect of the invention.

Moreover, an embodiment of a computer readable storage medium according to the first aspect of the invention is described, in which computer program code is stored. The computer program code causes a device to realize the actions of the embodiment of the method presented for the first aspect when executed by a processor. Moreover, an embodiment of a computer readable storage medium according to the second aspect of the invention is described, in which computer program code is stored. The computer program code causes a device to realize the actions of the embodiment of the method presented for the second aspect when executed by a processor.

In both embodiments, the computer readable storage medium is a non-transient medium and could be for example a disk or a memory or the like. The computer program code could be stored in the computer readable storage medium in the form of instructions encoding the computer-readable storage medium. The computer readable storage medium may be intended for taking part in the operation of a device, like an internal or external hard disk of a computer, or be intended for distribution of the program code, like an optical disc.

It is to be understood that also the computer program code by itself has to be considered an embodiment of either of the aspects of the invention.

An embodiment of a system according to the invention comprises any of the presented embodiments of an apparatus according to the invention and a decoder, in particular a decoder configured to reconstruct at least two channels of a stereophonic signal from received mid channel signals and side channel signals.

Any of the described embodiments of an apparatus may comprise only the indicated components or one or more additional components. Any of the described embodiments of the apparatuses according to the invention may be for instance a module or component for a device. Alternatively, any of the described embodiments of the apparatuses according to the invention may be for instance a device, like a mobile device.

In any of the described embodiments of a method, the method may also be an information providing method, and in any of the described first embodiments of an apparatus, the apparatus may also be an information providing apparatuses. In any of the described first embodiments of an apparatus, the means of the apparatus may be processing means.

In certain embodiments of the methods presented for the first aspect, the methods are methods of encoding a stereophonic signal. In certain embodiments of the apparatuses presented for the first aspect, the apparatuses are apparatuses for encoding a stereophonic signal.

It is to be understood that the presentation of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE FIGURES

In some audio coding systems, it may be desirable that devices supporting a coding of stereophonic signals retain backwards compatibility with devices supporting only a processing of mono audio signals. This may be of particular interest when speech communication is involved.

M/S coding is suited for creating a simple backwards compatible stereo communication system. In such a system, a sender supporting M/S stereo encoding could encode the mid channel and transmit the encoded mid channel to a receiver, if only a mono output is supported or desired at the receiver. The sender could further code both the mid and side channels and transmit them to a receiver, if stereo output is supported and desired at the receiver.

For a backward compatible system, a sender may thus always use an M/S coding scheme for encoding an stereophonic signal for transmission, even if the original audio channels are not correlated and if a separate encoding of the original audio right channels would require fewer bits than an M/S coding. In a system in which backward compatible mono coding is required, such as ITU-T G.718/G.729.1 stereo extension and 3GPP EVS, the coding of the mid channel is defined bitwise exactly.

As indicated above, using M/S coding in the case of uncorrelated original audio channels may result in audible quantization noise at receivers that reconstruct a stereophonic signal based on received mid and side channel signals. In order to reduce audible effects of quantization errors in reconstructed stereophonic signals, it is proposed for certain embodiments of the invention that masking thresholds are taken into account in the quantization of the side channel in an M/S coding scheme, in order to improve the distribution of quantization noise to the reconstructed channels.

Figure 1:
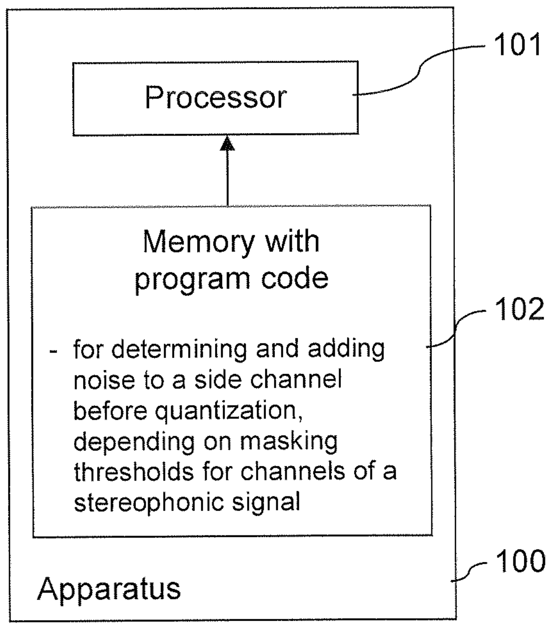
FIG. 1 is a schematic block diagram of an exemplary embodiment an apparatus according to a first aspect of the invention.

FIG. 1 is a schematic block diagram of an exemplary embodiment of an apparatus according to the first aspect of the invention.

Apparatus 100 comprises a processor 101 and, linked to processor 101, a memory 102. Memory 102 stores computer program code, which is designed for determining artificial noise depending on a masking threshold for channels of an audio signal and for adding this artificial noise to a side channel before quantization. Such piece of code may be integrated in a more comprehensive code for encoding audio signals, including quantization. Processor 101 is configured to execute computer program code stored in memory 102 in order to cause a device to perform desired actions.

An operation of apparatus 100 will now be described with reference to the flow chart of FIG. 2. The operation is an exemplary embodiment of a method according to the first aspect of the invention. Processor 101 and the program code stored in memory 102 cause a device to perform the operation when the program code is retrieved from memory 102 and executed by processor 101.

The device determines a respective masking threshold for at least two channels of a stereophonic signal (action 201). The at least two channels could be a left channel and a right channel, but they could equally comprise three or more channels. For each channel, a single masking threshold or a plurality of masking thresholds may be determined, for instance one for each of a plurality of frequency bands and/or for each of a plurality of blocks of time.

The device then determines an amount of noise in dependence on a difference between the determined masking thresholds for the at least two channels (action 202).

The device then adds the determined amount of noise to a side channel, wherein the side channel has been obtained by converting the stereophonic signal at least into a mid channel and the side channel (action 203). In case the stereophonic signal comprises more than two channels, there could also be two or more side channels to which noise is added.

The device then quantizes the mid channel and the side channel for transmission (action 204).

Figure 2:
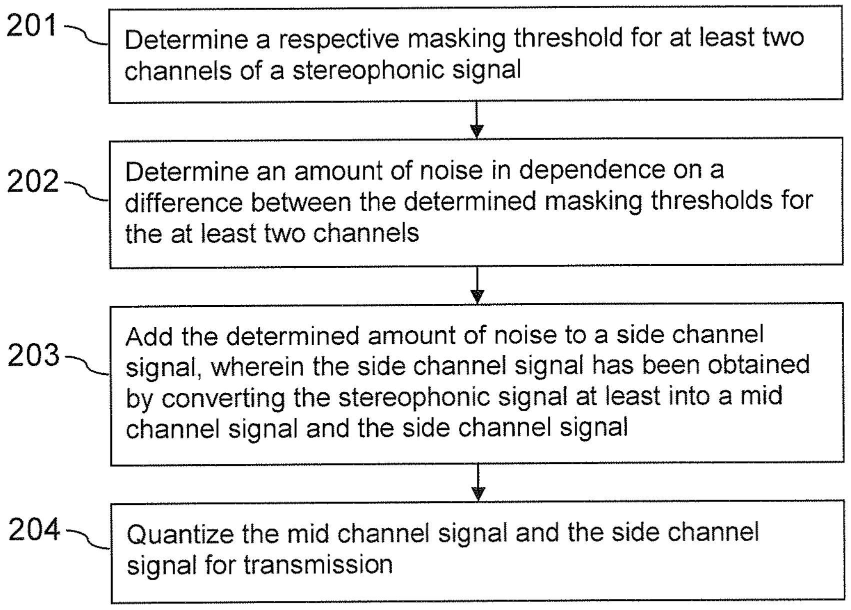
FIG. 2 is a flow chart illustrating an exemplary embodiment of a method according to a first aspect of the invention.

The operation presented in FIG. 2 thus enables a device to consider masking thresholds for quantization. Masking thresholds can be determined based on a psychoacoustic model and they indicate the amount of noise that can be added to a channel basically without being perceivable to a user. By adding noise to the side channel considering such masking thresholds in an M/S coding, the quantization noise can be distributed for instance to left and right channel in a way that the quantization noise is perceptually as little disturbing as possible. This enables the implementation of a backwards compatible system, while maintaining a high quality of provided stereophonic signals. The device can be for example a mobile device, like a mobile communication device, but it could equally be a stationary device.

In certain embodiments, the operation further comprises determining the quantization noise resulting in the quantization of the mid channel, wherein the determined amount of noise is determined as the product of the quantization noise and an adjustable factor, and wherein the adjustable factor is set in response to a difference between the determined masking thresholds for the at least two channels.

In certain embodiments, this adjustable factor is limited to lie between −1 and 1.

In certain embodiments, the factor is selected from a predetermined set of factors.

In certain embodiments, determining the factor and quantizing the side channel signal comprises: selecting a plurality of factors from a predetermined set of factors in response to a difference between the determined masking thresholds for the at least two channels of the stereophonic signal; determining for different combinations of the selected factors and of a plurality of values of at least one quantization parameter used in quantizations of the side channel signal either the average of a quantization noise exceeding a masking threshold for the at least two channels of the stereophonic signal or the maximum of a quantization noise exceeding a masking threshold for the at least two channels of the stereophonic signal; and selecting the combination resulting in the minimum of the determined averages or the determined maxima for quantizing the side channel signal.

Traditionally, in an M/S coding system the quantization parameters of the side channel are chosen independently of the final output. Quantization noise can be thought of as a random process, though. Thus, different values of quantization parameters may result in different qualities of reconstructed channels of a stereophonic signal. The presented embodiment allows reducing the negative effect of a quantization noise mismatch by selecting a particular combination of added noise and of a value of at least one quantization parameter that is suited to minimize the average or maximum perceivable quantization noise in the reconstructed channels. For example, with two factors and two values of a particular parameter, four different combinations may be checked. The possible number of combination increases with an increasing number of factors, with an increasing number of parameters and with an increasing number of values for each considered parameter. The quantization parameters thus constitute an additional factor for further improving the perception of the quantization noise in the reconstructed signal.

The at least one quantization parameter may include for instance a quantization step size, a gain value and/or a codeword. The codeword may refer for instance to codewords in a Huffman codebook or vector quantization.

The different influence of different sets of quantization parameter values could also be exploited without adding artificial noise to the side channel. Such an approach will now be presented with reference to FIGS. 3 and 4.

Figure 3:
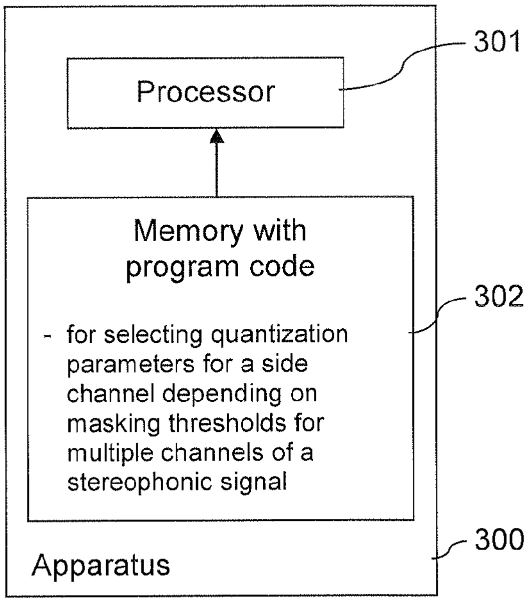
FIG. 3 is a schematic block diagram of an exemplary embodiment an apparatus according to a second aspect of the invention.

FIG. 3 is a schematic block diagram of an exemplary embodiment of an apparatus according to the second aspect of the invention.

Apparatus 300 comprises a processor 301 and, linked to processor 301, a memory 302. Memory 302 stores computer program code, which is designed for selecting a set of quantization parameter values for quantizing a side channel depending on masking thresholds for multiple channels of an audio signal. Processor 301 is configured to execute computer program code stored in memory 302 in order to cause a device to perform desired actions.

An operation of apparatus 300 will now be described with reference to the flow chart of FIG. 4. The operation is an exemplary embodiment of a method according to the second aspect of the invention. Processor 301 and the program code stored in memory 302 cause a device to perform the operation when the program code is retrieved from memory 302 and executed by processor 301.

The device determines a respective masking threshold for at least two channels of a stereophonic signal (action 401).

The device further determines for each of different combinations of values of a plurality of quantization parameters used in quantizations of a side channel signal either an average of a quantization noise exceeding a masking threshold for the at least two channels of the stereophonic signal or a maximum of a quantization noise exceeding a masking threshold for the at least two channels of the stereophonic signal. The side channel signal has been obtained by converting the stereophonic signal at least into a mid channel signal and the side channel signal. (action 402)

The device further selects the combination of values of the plurality of quantization parameters resulting in the minimum of the determined averages or the minimum of the determined maxima, respectively (action 403).

The device further quantizes the mid channel signal and the side channel signal for transmission using the determined combination of values of quantization parameters (action 404). It is to be understood that this action may comprise performing an additional, final quantization of the side channel signal, or re-using a quantized side channel signal that is already available from the selection.

Certain embodiments of the second aspect of the invention may thus allow reducing the negative effect of a quantization noise mismatch by selecting at least for a side channel signal quantization parameters that are suited to minimize the average perceivable quantization noise in the reconstructed channels or, alternatively, that are suited to minimize the maximum perceivable quantization noise in the reconstructed channels. This approach has the effect that it could be implemented by extending an existing quantization process. It does not necessarily require a determination of some additional noise. Furthermore, it may have the effect that the set of quantization parameters values is selected that is best suited for all channels in combination. Thus, instead of minimizing for instance the quantization noise in each reconstructed channel of the stereophonic signal, it may be suited to optimize the distribution of quantization noise to all channels, which may be even more important for the perceived quality of the reconstructed stereophonic signal.

Exemplary quantization parameters may include again a quantization step size, a gain value and/or a codeword.

It is to be understood that quantization parameters that are to be used for the quantization of the mid channel signals could equally be considered in the different sets of parameter values.

Figure 4:
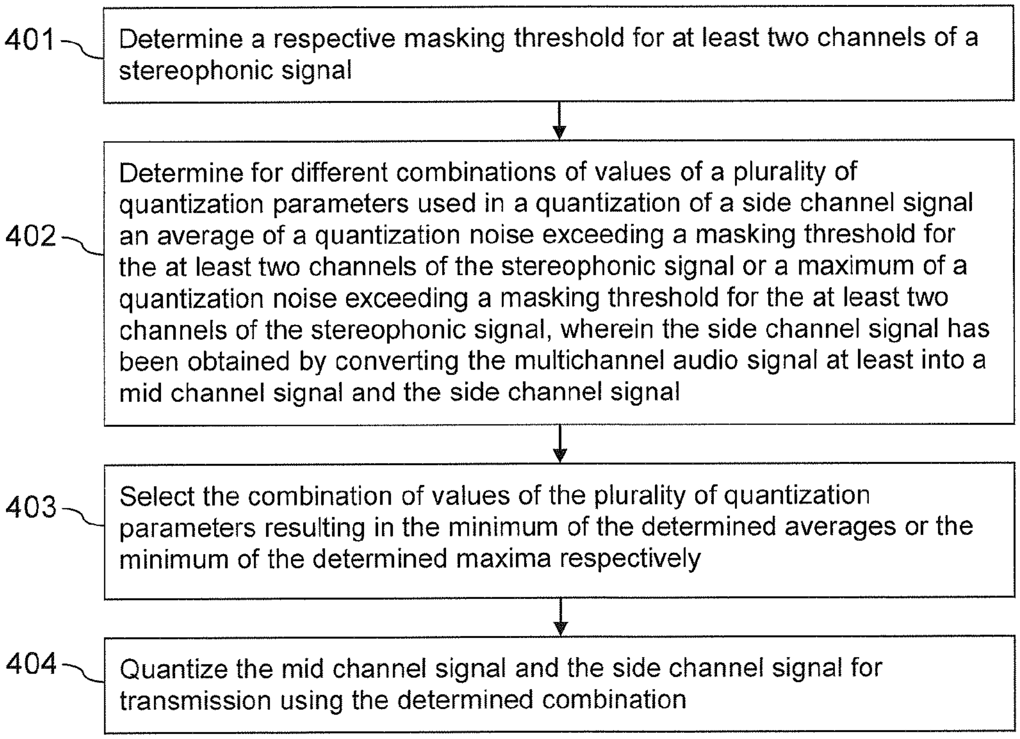
FIG. 4 is a flow chart illustrating an exemplary embodiment of a method according to a second aspect of the invention.

Apparatus 100 illustrated in FIG. 1 and the operation illustrated in FIG. 2 as well as apparatus 300 illustrated in FIG. 3 and the operation illustrated in FIG. 4 may be implemented and refined in various ways.

In an exemplary embodiment, apparatus 100 or 300 could comprise one or more additional components, including for instance a user interface, a memory, and/or a transceiver configured to enable an exchange of data via a radio interface and/or an interface configured to enable an exchange of data via a communication network. Apparatus 100 or 300 could be for instance a stationary device, like a personal computer or a content server, or a mobile device, like a mobile phone, a laptop or a netbook. Alternatively, it could be a module for a device, like a chip, a circuitry on a chip or a plug-in module.

In exemplary embodiments of the first or second aspect, the quantization is used in an algebraic code excited linear prediction loop. This may allow improving the stereo coding performance in a way that provides backwards compatibility with existing mono coding standards.

In exemplary embodiments of the first or second aspect, the audio signal comprises speech. For speech signals, backward compatibility is of particular importance.

Figure 5:
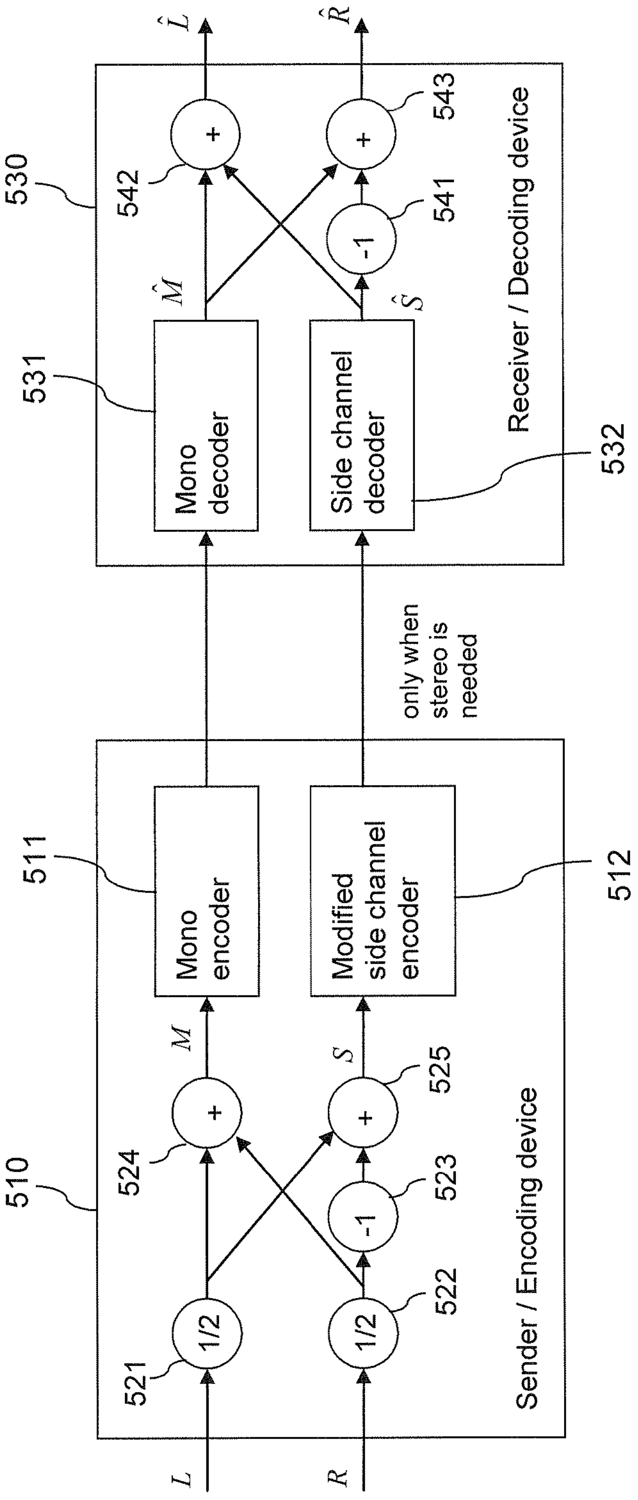
FIG. 5 is a schematic block diagram of an exemplary embodiment of a system according to the invention.

FIG. 5 is a schematic block diagram of an exemplary backwards compatible stereo communication system in which an embodiment of the invention may be implemented.

The system comprises a sender or encoding device 510 and a receiver or decoding device 530. The sender 510 comprises a mono encoder 511 and a side channel encoder 512. The sender 510 further comprises dividers 521, 522, an inverter 523 and summing means 524, 525 for combining an available left channel signal L and an available right channel signal R into a mid channel signal M, and for creating a side channel signal S by a different mixing of left channel signal L and right channel signal R:

$$M=\alpha L+(1-\alpha)R$$

$$S=\alpha L-(1-\alpha)R \quad (1)$$

The parameter $\alpha$ in these equations may be fixed or variable. If it is fixed, it could be set for instance to $\alpha=1/2$ to obtain an equivalent contribution of both channels. If it is variable, it could be selected for instance such that it minimizes the energy in channel S.

The mono encoder 511 is configured to quantize and further encode the mid channel signal M for transmission, and the side channel encoder 512 is configured to quantize and further encode the side channel signal S for transmission. If a receiver is capable of processing stereophonic signals, both mid channel signal M and side channel signal S are quantized, further encoded and transmitted; if a receiver is only capable of processing mono audio signals, only the mid channel signal M is quantized, further encoded and transmitted.

There is no selection between M/S coding and L/R coding in sender 510 in order to ensure backward compatibility. It is to be understood, however, that such a selection could be enabled for cases in which the sender 510 can be informed in advance about the capabilities of the receiver or receivers.

The depicted receiver 530 is able to process stereophonic signals and comprises to this end a mono decoder 531 and a side channel decoder 532. The mono decoder 531 is configured to decode received mono channel signals and the side channel decoder 532 is configured to decode received side channel signals.

The receiver 530 further comprises an inverter 541 and summing means 542, 543 for reconstructing a left channel signal $\hat{L}$ and a right channel signal $\hat{R}$ based on a decoded mono signal $\hat{M}$ and a decoded side channel signal $\hat{S}$ as follows:

$$\hat{L}=\frac{1}{2\alpha}\hat{M}+\frac{1}{2\alpha}\hat{S} \quad (2)$$

-continued $$\hat{R} = \frac{1}{2(1-\alpha)}\hat{M} - \frac{1}{2(1-\alpha)}\hat{S}$$

The parameter α is set to the same value as in sender 510. The reconstructed left channel signal $\hat{L}$ and right channel signal $\hat{R}$ could then, for instance, be presented to a user as a stereophonic signal.

In a conventional system, the quantization at sender 510 would result in traditional quantized mid channel $\hat{M}$ and traditional quantized side channel $\hat{S}^{trad.}$:

$$\hat{M} = \alpha L + (1-\alpha)R + Q_M$$

$$\hat{S}^{trad.} = \alpha L - (1-\alpha)R + Q_S^{trad.} \quad (3)$$

where $Q_M$ and $Q_S^{trad.}$ are the traditional quantization noises in quantized mid channel signal and quantized side channel signal, respectively.

In the embodiment of FIG. 5, however, the quantization of side channel signal S by side channel encoder 512 is modified. The quantization noise $Q_M$ introduced to the mid channel signal is multiplied by a factor β, and the result is added to the side channel S before quantization. The quantized mid channel signal $\hat{M}$ is not affected by this modification, but the quantized side channel signal $\hat{S}$ is different from a conventional quantized side channel signal:

$$\hat{M} = \alpha L + (1-\alpha)R + Q_M$$

$$\hat{S} = \alpha L - (1-\alpha)R + \beta Q_M + Q_S \quad (4)$$

When reconstructing the left and right channel signals $\hat{L}$ and $\hat{R}$ from such mid and side channel signals, the final result—compared to the original left and right channel signals L and R—is:

$$\hat{L} = L + \frac{1}{2\alpha}(1+\beta)Q_M + \frac{1}{2\alpha}Q_S \quad (5)$$

$$\hat{R} = R + \frac{1}{2(1-\alpha)}(1-\beta)Q_M - \frac{1}{2(1-\alpha)}Q_S$$

Or, when assuming α=1/2 for reasons of simplicity:

$$\hat{L} = \alpha L + (1-\beta)Q_M + Q_S$$

$$\hat{R} = \alpha L - (1-\beta)Q_M - Q_S \quad (4)$$

It can be seen from equations (5) and (6) that the distribution of the quantization noise to reconstructed left and right channel signals $\hat{L}$ and $\hat{R}$ can be controlled with a suitable selection of parameter β. For example, if a masking threshold $T_L$ for the left channel signal L is much higher than the masking threshold $T_R$ for the right channel signal R, a selection of β=1 results in bigger quantization noise in reconstructed left channel signal L than in reconstructed right channel signal $\hat{R}$. With this selection of the quantization noise will be less disturbing, since the left channel signal is able to mask a bigger quantization noise than the right channel signal. In one possible alternative, β may be selected such that the difference in the quantization noise between reconstructed left and right channel signals $\hat{L}$ and $\hat{R}$ is the same as the difference between the masking thresholds $T_L$ and $T_R$ determined for the L and R channel signals. An estimate for β for approximating such a relation could be:

$$\beta = \frac{2\alpha(1-\alpha)(T_L - T_R) + (2\alpha - 1)Q_M}{Q_M}, \quad (7)$$

when neglecting quantization noise $Q_S$.

In another alternative, β could be selected such that the ratio of the quantization noise in reconstructed left channel signal $\hat{L}$ to the quantization noise in reconstructed right channel signal $\hat{R}$ is the same as the ratio of the masking threshold $T_L$ to the masking threshold $T_R$ determined for the L and R channel signals. An estimate for β for approximating such a relation could be:

$$\beta = \frac{\alpha T_L - (1-\alpha)T_R}{\alpha T_L + (1-\alpha)T_R}, \quad (7a)$$

when neglecting quantization noise $Q_S$.

With both equations, the noise $\beta Q_M$ that is to be added to the side channel signal can be computed easily. In addition, they allows limiting the added noise in an adaptive manner simply by limiting β to lie within a desired range. The parameter β is preferably limited to be −1≤β≤1. Theoretically, the total system noise increases without any benefits if β exceeds these limits. In practice, values slightly below or above −1 and +1 respectively may still provide a benefit for the perceived quality, though.

When the final amount of added artificial noise is calculated using for example one of these equations, the increase in complexity can be kept minimal. It is to be understood, however, that various other approaches for selecting β could be used as well.

It is further to be understood that it would also be possible to compute the amount of noise that is to be added to the side channel signal directly, instead of computing at first a factor β.

Figure 6:
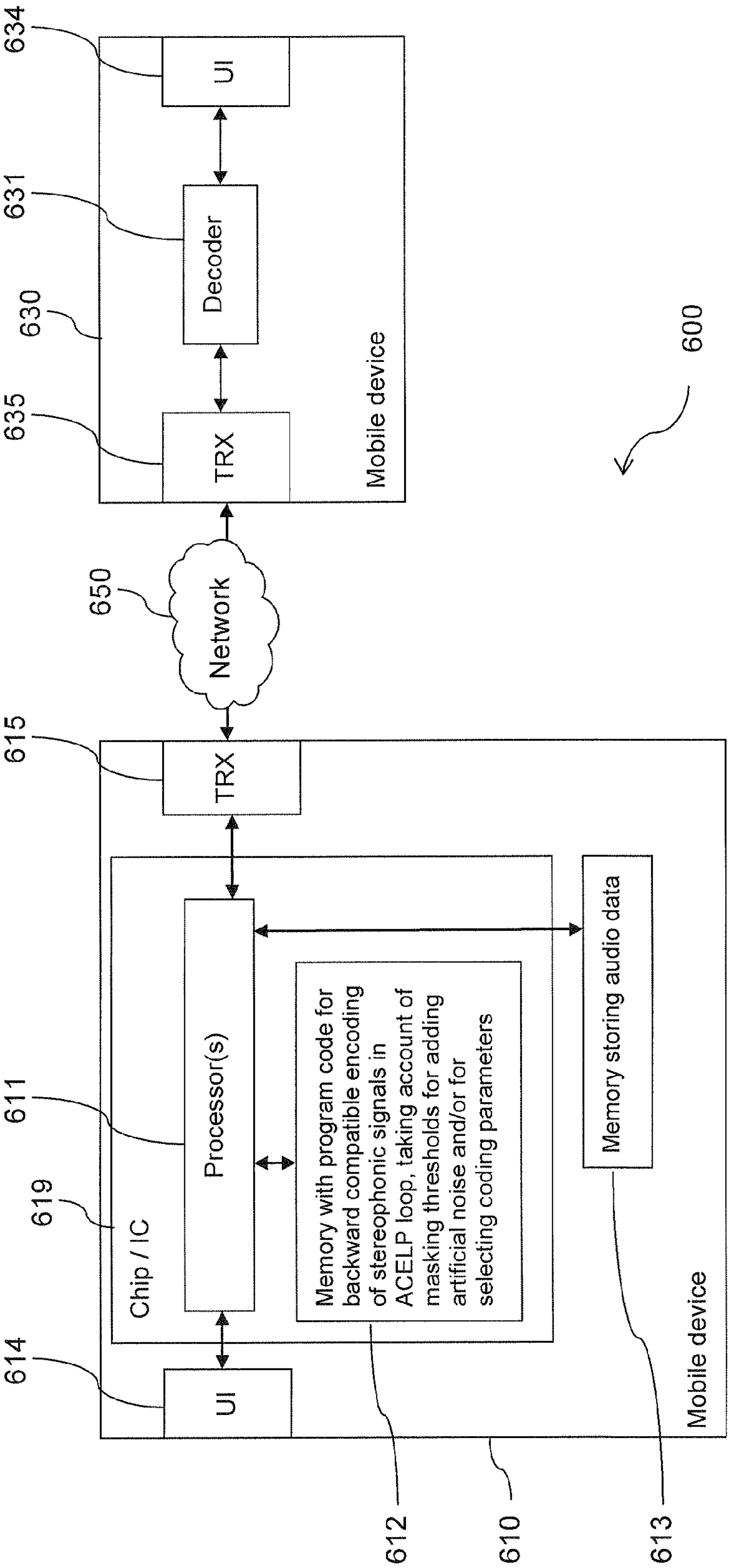
FIG. 6 is a further schematic block diagram of an exemplary embodiment of a system according to the invention.

FIG. 6 is a schematic block diagram presenting an exemplary embodiment of a system according to the invention, which may correspond to the system of FIG. 5 in a different representation.

In FIG. 6, system 600 comprises a first device 610, a second device 630 and a communication network 650 interconnecting device 610 and device 630. Network 650 could be for example the Internet or a cellular communication network or a combination of both.

Device 610 could be any kind of device that supports a backward compatible coding of stereophonic data. It could be for instance a server, a mobile phone, a laptop or a netbook. By way of example, it is assumed to be a mobile device.

Device 610 may comprise a processor 611 that is linked to a first memory 612, a second memory 613 and at least one transceiver (TRX) 615.

Processor 611 is configured to execute computer program code, including computer program code stored in memory 612, in order to cause device 610 to perform desired actions. Memory 612 stores computer program code for encoding stereophonic data. The computer program code may comprise for example similar program code as the program code stored in memory 102. In addition, memory 612 may store computer program code implemented to realize other functions, as well as any kind of other data.

Processor 611 and memory 612 may optionally belong to a chip or an integrated circuit 619, which may comprise in addition various other components, for instance a further processor or memory, or a part of transceiver 615, etc.

Memory 613 may store for instance original and/or coded audio data and it can be accessed by processor 611. Memory 613 may be for example an integrated memory of device 610, like a local cache, or an exchangeable memory card.

The at least one transceiver 615 enables device 610 to communicate with other devices, like device 630, either directly or via communication network 650. The at least one transceiver 615 could comprise for instance a transceiver enabling an access to a cellular communication network, like a GSM or UMTS network. Alternatively or in addition, the at least one transceiver 615 may comprise for instance a WLAN transceiver enabling an access to wireless local area networks, or a Bluetooth transceiver enabling a direct link to another device. Instead of or in addition to transceiver 615, an interface for a wired connection could be provided.

User interface 614 comprises components enabling a user input and components for providing an output to a user. User interface 614 may comprise for instance a keyboard, a display, a touchscreen, a microphone, speakers, etc.

Component 619 or device 610 could correspond to an exemplary embodiment of an apparatus according to the first or second aspect of the invention.

Device 630 could be any kind of device that is able to decode encoded audio data. It could be for instance a server, a mobile phone, a laptop or a netbook. By way of example, it is assumed to be a mobile device.

Device 630 comprises a transceiver 635 or another interface that is configured to receive coded audio data from another device, for instance via network 650. The transceiver 635 is linked to a decoder 631, and the decoder 631 is configured to decode received coded audio data. Decoder 631 is further linked to a user interface 634 that is configured to present decoded audio data to a user.

An exemplary operation in system 600 of FIG. 6 will now be described with reference to the flow chart of FIG. 7. Device 610 is caused by processor 611 to perform the presented actions when executing program code that is stored in memory 612.

Device 610 is configured to encode a stereophonic signal including a left channel signal L and a right channel signal R in a backward compatible manner. The encoding is embedded in an ACELP loop. The stereophonic signal may be received for instance via the user interface 614 or be stored in memory 613. Device 610 may divide the signal in each channel into blocks of 5-50 ms length and perform a transformation into the frequency domain using STFT or any other kind of transform, for instance a fast Fourier transform (FFT). The further processing may be performed separately for each block for each of a plurality of frequency bands, for instance for approximately 50 different frequency bands. The blocks may be overlapping or non-overlapping. Further, they may have any other desired length. If desired, even a single block could be used for the entire signal. The division into frequency bands is optional. Furthermore, any other number of frequency bands could be used.

Device 610 generates a mid channel M from the left and right channel signals L and R as described above with reference to FIG. 5 using equation (1), with a variable or a fixed value for parameter $\alpha$ (action 701).

Device 610 further generates a side channel S from the left and right channel signals L and R as described above with reference to FIG. 5 using equation (1), with the same value for parameter $\alpha$ (action 702).

Device 610 further determines a masking threshold $T_L$ for the left channel L and a masking threshold $T_R$ for the right channel R using a psychoacoustic model (action 703).

A suitable psychoacoustic model has been presented for example by Johnston, J. D., in: "*Transform coding of audio signals using perceptual noise criteria*" Selected Areas in Communications, IEEE Journal, vol. 6, no. 2, pp. 314-323, February 1988. While the presented model is meant for mono signals, it can simply be used for L and R channels separately to obtain a masking threshold for each channel. Alternatively, a stereo psychoacoustic model could be used. As an example, the previous model can be extended to stereo by adding inter-aural masking effects. Such an approach has been presented for instance by Zwislocki, J. J., in: "*A theory of central auditory masking and its partial validation*", Journal of the Acoustical Society of America 52:644-659, 1972.

Device 610 further quantizes the obtained mid channel signal M, resulting in quantized signal $\hat{M}$ (action 704). The quantized signal $\hat{M}$ is encoded and provided for transmission.

Device 610 determines in addition a quantization noise for the mid channel signal as $Q_M=\hat{M}-M$ (action 705).

Device 610 now determines an artificial noise factor $\beta$ as described above with reference to FIG. 5 using equation (7), again with the same value for parameter $\alpha$ (action 706).

Device 610 then adds artificial noise having an amount of $\beta Q_M$ to the side channel signal S determined in action 702 (action 707).

Device 610 finally quantizes the modified side channel (action 708). The quantized side channel is encoded and provided as well for transmission. It may be multiplexed for the actual transmission with the quantized and encoded mid channel signal provided in action 704 as well as with other data, for example the employed value of parameter $\alpha$. The multiplexed data may then be transmitted via transceiver 615 and network 650 to device 630.

The quantization of mid and side channel signals can be considered to be a part of the encoding of mid and side channel signals, which may be followed and/or preceded by some additional coding processes.

It has to be noted that alternatively or in addition, device 610 could also store the encoded signals and associated data in memory 613 for later use.

Device 630 may receive and demultiplex the multiplexed data, decode the mid and side channel signals and reconstruct left and right channel signals for presentation to a user. Device 630 may be a conventional device supporting M/S decoding. The quantization noise will be distributed automatically in an advantageous manner to reconstructed left and right channel due to the modification at the sender side.

A variation of the operation presented in FIG. 7 will now be described with reference to the flow chart of FIG. 8.

Figure 7:
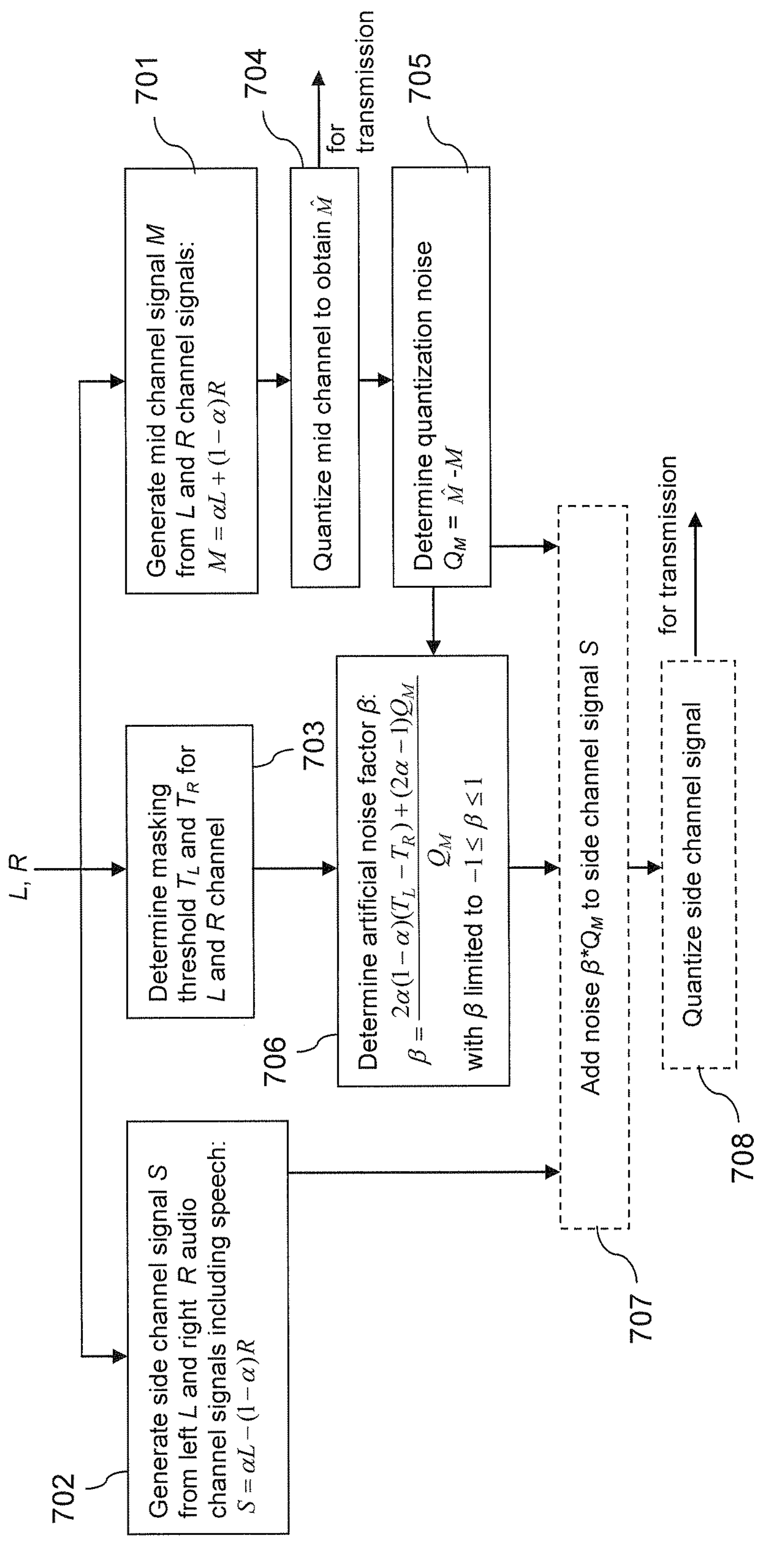
FIG. 7 is a flow chart illustrating an exemplary operation in the system of FIG. 6.

In this embodiment, actions 701 through 706 are the same as in FIG. 7. These actions are not depicted again. Actions 707 and 708, however, are replaced by depicted actions 801 through 805. Device 610 is caused by processor 611 to perform the presented actions when executing program code that may be stored alternatively to the program code required for the operation illustrated in FIG. 7 in memory 612.

In this case, the noise factor $\beta$ that is determined in action 706 is only a preliminary factor.

Device 610 stores a set of selectable values that are allowed as final noise factors $\beta$ in memory 612 or memory 613. The set may be for instance:

$$\beta \in \left\{-1, -\frac{1}{2}, -\frac{1}{3}, -\frac{1}{4}, 0, \frac{1}{4}, \frac{1}{3}, 1\right\} \quad (8)$$

Device 610 selects from this set a number i of fixed values $\beta_i$ that are similar to the computed preliminary noise factor β determined in action 706 (action 801).

Device 610 could select for instance two values from the set that are smaller than the computed value and two values from the set that are greater than the computed value. For example, if the preliminary artificial noise factor β computed in action 706 based on equation (7) was β≈−0.27, device 610 could select the values −½, −⅓, −¼, 0 as values $\beta_i$ with i=1 . . . 4.

Device 610 then adds a respective noise $\beta_i Q_M$ to the side channel signal S determined in action 702 and quantizes each of the resulting i modified side channel signals with different sets of quantization parameter values (action 802). The result are j different alternatives for the quantized side channel signal $\hat{S}_j$. The number j of alternatives can be for instance a number up to i times the number of different sets of quantization parameter values. The mid channel quantization noise $Q_M$ is known from action 705.

Device 610 then reconstructs left and right channels signals $\hat{L}$ and $\hat{R}$ for each alternative for quantized side channel signal $\hat{S}_j$ using in addition quantized mid channel signal $\hat{M}$ obtained in action 704 (action 803).

Device 610 then determines the average of perceivable quantization noise:

$$\text{Average}(L-\hat{L}-T_L, R-\hat{R}-T_R) \quad (9)$$

for each of the j reconstructed pairs of channels that is associated to a particular alternative of quantized side channel (action 804). L and R in equation (9) are the original left and right channel signals, and the masking thresholds $T_L$ and $T_R$ are available from action 703.

Alternatively, device 610 could determine the maximum of perceivable quantization noise:

$$\text{Maximum}(L-\hat{L}-T_L, R-\hat{R}-T_R) \quad (10)$$

for each of the j reconstructed pairs of channels that is associated to a particular alternative of quantized side channel signal $\hat{S}_j$.

Device 610 then selects the alternative of the quantized side channel signals $\hat{S}_j$ that results in the minimum of the determined average values or in the minimum of the determined maximum values, respectively (action 805). The selected alternative of the quantized side channel signals $\hat{S}_j$ corresponds to the combination of the set of quantization parameter values and of a respective one of the four selected noise factor values $\beta_i$ which can be expected to result in the most appropriate distribution of quantization noise to the reconstructed left and right channel signals that will be presented to a user.

The selected quantized side channel signal is encoded and provided for transmission. It is to be understood that the quantization resulting in j alternatives in action 802 could be a simplified quantization. In this case, a final quantization is carried out using the factor and the set of quantization parameters that had been used for the selected quantized side channel signal. The final quantized side channel signal may be multiplexed again with the provided quantized and encoded mid channel signal for the actual transmission to device 630.

Figure 8:
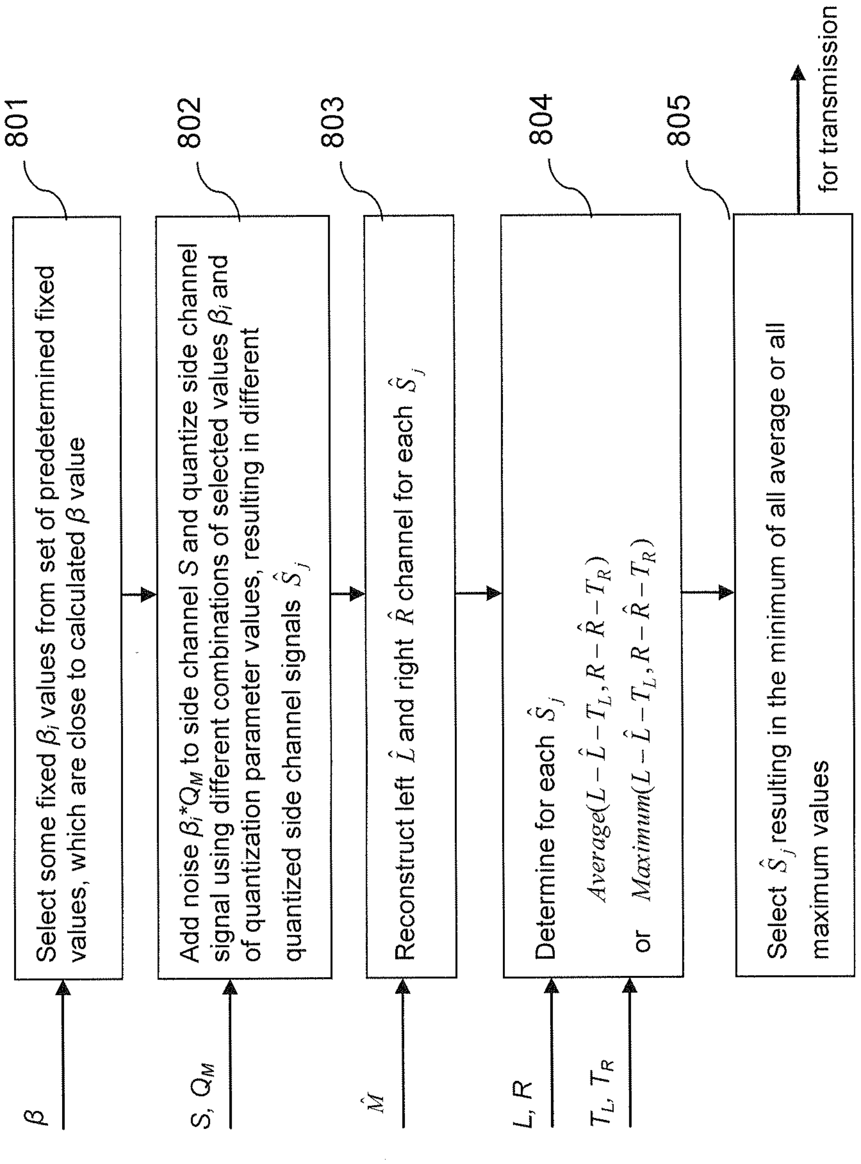
FIG. 8 is a flow chart illustrating an exemplary variation of the operation illustrated in FIG. 7.

The embodiment of FIG. 8 is suited to reduce the impact of the constellation that the final quantization noise $Q_S$ in the side channel signal S cannot be considered in the initial estimation of β in accordance with equation (7), or equation (7a), since the final quantization noise $Q_S$ is not known before β has been determined.

The embodiment of FIG. 8 can be considered to be a combination of an embodiment of the first aspect of the invention as presented in FIGS. 1 and 2 and of the second aspect as presented in FIGS. 3 and 4. For an embodiment of the second aspect only (as presented in FIGS. 3 and 4), β could simply be set to 0, and the distribution of quantization noise to reconstructed left and right channel signals could be controlled simply by testing different sets of parameter values for quantizing the side channel S and by choosing the set of quantization parameter values that minimize equation (9) or equation (10).

In this case, all values that could be created by adding $\beta Q_M$ to the side channel signal S can be considered implicitly by testing all possible values of quantization parameters for selecting the most suitable set of quantization parameters for quantizing the side channel signal S.

All actions presented in FIGS. 7 and 8 could also be carried out for instance by modified side channel encoder 512 of FIG. 5, except for action 701, which could be carried out for instance by mono encoder 511 of FIG. 5.

Summarized, certain embodiments of the invention thus improve the perceived quality of stereophonic signals in backwards compatible M/S stereo coding systems.

It has to be noted that while the embodiments of FIGS. 7 and 8 have been presented for a quantization in the frequency-domain, the same approach could be used for a quantization in the time-domain.

While embodiments have been presented that support a backwards compatibility for mono receivers, it is to be understood that the same approach could be used as well in a system in which all receivers support stereo processing, but in which using M/S coding only is desired for some other reason, for instance for avoiding the need of implementing different coding schemes.

Any of the presented embodiments can be applied to code excitation search of mid and side channels in an algebraic code-excited linear prediction (ACELP) framework.

FIGS. 2, 4, 7 and 8 may also be understood to represent exemplary functional blocks of a computer program code for encoding a stereophonic signal.

Any presented connection in the described embodiments is to be understood in a way that the involved components are operationally coupled. Thus, the connections can be direct or indirect with any number or combination of intervening elements, and there may be merely a functional relationship between the components.

Further, as used in this text, the term 'circuitry' refers to any of the following:

(a) hardware-only circuit implementations (such as implementations in only analog and/or digital circuitry)

(b) combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this text, including in any claims. As a further example, as used in this text, the term 'circuitry' also covers an implementation of merely a processor (or multiple processors) or portion of a processor and its (or their) accompanying software and/or firmware. The term 'circuitry' also covers, for example, a baseband integrated circuit or applications processor integrated circuit for a mobile phone.

Any of the processors mentioned in this text could be a processor of any suitable type. Any processor may comprise but is not limited to one or more microprocessors, one or more processor(s) with accompanying digital signal processor(s), one or more processor(s) without accompanying digital signal processor(s), one or more special-purpose computer chips, one or more field-programmable gate arrays (FPGAS), one or more controllers, one or more application-specific integrated circuits (ASICS), or one or more computer(s). The relevant structure/hardware has been programmed in such a way to carry out the described function.

Any of the memories mentioned in this text could be implemented as a single memory or as a combination of a plurality of distinct memories, and may comprise for example a read-only memory, a random access memory, a flash memory or a hard disc drive memory etc.

Moreover, any of the actions described or illustrated herein may be implemented using executable instructions in a general-purpose or special-purpose processor and stored on a computer-readable storage medium (e.g., disk, memory, or the like) to be executed by such a processor. References to 'computer-readable storage medium' should be understood to encompass specialized circuits such as FPGAs, ASICs, signal processing devices, and other devices.

The functions illustrated by processor 101 in combination with memory 102 presented in FIG. 1 or component 609 presented in FIG. 6 can also be viewed as means for determining a respective masking threshold for at least two channels of a stereophonic signal; means for determining an amount of noise in response to a difference between the determined masking thresholds for the at least two channels; means for adding the determined amount of noise to a side channel signal, wherein the side channel signal has been obtained by converting the stereophonic signal at least into a mid channel signal and the side channel signal; and means for quantizing the mid channel signal and the side channel signal for transmission.

The program code in memory 102 or memory 612 can also be viewed as comprising such means in the form of functional modules.

The functions illustrated by processor 301 in combination with memory 302 presented in FIG. 3 or component 609 presented in FIG. 6 can also be viewed as means for determining a respective masking threshold for at least two channels of a stereophonic signal; means for determining for each of different combinations of values of a plurality of quantization parameters used in quantizations of a side channel signal either an average of a quantization noise exceeding a masking threshold for the at least two channels of the stereophonic signal or a maximum of a quantization noise exceeding a masking threshold for the at least two channels of the stereophonic signal, wherein the side channel signal has been obtained by converting the stereophonic signal at least into a mid channel signal and the side channel signal; means for selecting the combination of values of the plurality of quantization parameters resulting in the minimum of the determined averages or the minimum of the determined maxima, respectively; and means for quantizing the mid channel signal and the side channel signal for transmission using the determined combination of values of quantization parameters.

The program code in memory 302 or 612 can also be viewed as comprising such means in the form of functional modules.

It will be understood that all presented embodiments are only exemplary, and that any feature presented for a particular exemplary embodiment may be used with any aspect of the invention on its own or in combination with any feature presented for the same or another particular exemplary embodiment and/or in combination with any other feature not mentioned. It will further be understood that any feature presented for an exemplary embodiment in a particular category may also be used in a corresponding manner in an exemplary embodiment of any other category.

What is claimed is:

1. A method comprises:

determining, by a device, a respective masking threshold for each of at least two channels of a stereophonic signal;

determining an amount of noise in response to a difference between the determined respective masking threshold for each of the at least two channels of the stereophonic signal;

adding the determined amount of noise to a side channel signal, wherein the side channel signal has been obtained by converting the stereophonic signal at least into a mid channel signal and the side channel signal;

quantizing the mid channel signal and the side channel signal for transmission;

transmitting, via a processor, at least the quantized mid channel signal and the side channel signal;

decoding the quantized mid channel signal and the side channel signal;

reconstructing left and right channel signals based on the decoded mid channel signal and the decoded side channel signal; and presenting the decoded left and right channel audio signals to a user via a user interface.

2. The method according to claim 1, further comprising determining quantization noise resulting from the quantization of the mid channel signal, wherein the determined amount of noise is determined as the product of the quantization noise and an adjustable factor, and wherein the adjustable factor is set in response to a difference between the determined respective masking threshold for each of the at least two channels of the stereophonic signal.

3. The method according to claim 2, wherein the adjustable factor is limited to lie between −1 and 1.

4. The method according to claim 2, wherein the adjustable factor is selected from a predetermined set of factors.

5. The method according to claim 2, wherein determining of the adjustable factor and quantizing the side channel signal comprises:

selecting a plurality of factors from a predetermined set of factors in response to a difference between the determined respective masking threshold for each of the at least two channels of the stereophonic signal;

determining either an average of a quantization noise exceeding each respective masking threshold for each of the at least two channels of the stereophonic signal or a maximum of a quantization noise exceeding each respective masking threshold for the at least two channels of the stereophonic signal, wherein the determining of the average or maximum is performed for different combinations of the selected plurality of factors and of a plurality of values of at least one quantization parameter used in quantization of the side channel signal; and selecting the combination resulting in a minimum of the determined averages or the determined maxima for quantizing the side channel signal.

6. The method according to claim 1, wherein the quantization is used in an algebraic code excited linear prediction loop.

7. The method according to claim 1, wherein the audio signal comprises speech.

8. A method, comprising:

determining, by a device, a respective masking threshold for each of at least two channels of a stereophonic signal;

determining either an average of a quantization noise exceeding each respective masking threshold for each of the at least two channels of the stereophonic signal or a maximum of a quantization noise exceeding each respective masking threshold for each of the at least two channels of the stereophonic signal, wherein the determining is performed for each of different combinations of values of a plurality of quantization parameters used in quantization of a side channel signal, wherein the side channel signal has been obtained by converting the stereophonic signal at least into a mid channel signal and the side channel signal;

selecting, a combination of values of the different combination of values of the plurality of quantization parameters which results in a minimum of the determined averages or a minimum of the determined maxima, respectively;

quantizing the mid channel signal and the side channel signal for transmission using the selected combination of values of the different combination of values of quantization parameters;

transmitting at least the quantized mid channel signal and the side channel signal;

decoding the quantized mid channel signal and the side channel signal;

reconstructing left and right channel signals based on the decoded mid channel signal and the decoded side channel signal; and presenting the decoded left and right channel audio signals to a user via a user interface.

9. The method according to claim 8, wherein the quantization is used in an algebraic code excited linear prediction loop.

10. The method according to claim 8, wherein the audio signal comprises speech.

11. An apparatus comprising at least one processor and at least one memory including computer program code, the at least one memory and the computer program code configured to, with the at least one processor, cause the apparatus device at least to:

determine a respective masking threshold for each of at least two channels of a stereophonic signal stored in the at least one memory;

determine an amount of noise in response to a difference between the determined respective masking threshold for each of the at least two channels of the stereophonic signal;

add the determined amount of noise to a side channel signal, wherein the side channel signal has been obtained by converting the stereophonic signal at least into a mid channel signal and the side channel signal;

quantize the mid channel signal and the side channel signal for transmission;

transmit, via a processor, at least the quantized mid channel signal and the side channel signal;

decode the quantized mid channel signal and the side channel signal;

reconstruct left and right channel signals based on the decoded mid channel signal and the decoded side channel signal; and present the decoded left and right channel audio signals to a user via a user interface.

12. The apparatus according to claim 11, wherein the at least one memory and the computer program code further configured to, with the at least one processor, cause the apparatus to determine quantization noise resulting from the quantization of the mid channel signal, to determine the determined amount of noise as the product of the quantization noise and an adjustable factor, and to set the adjustable factor in response to a difference between the determined respective masking threshold for each of the at least two channels of the stereophonic signal.

13. The apparatus according to claim 12, wherein the at least one memory and the computer program code further configured to, with the at least one processor, cause the apparatus to limit the adjustable factor to lie between −1 and 1.

14. The apparatus according to claim 12, wherein the at least one memory and the computer program code further configured to, with the at least one processor, cause the apparatus to select the adjustable factor from a predetermined set of factors.

15. The apparatus according to claim 12, wherein the at least one memory and the computer program code, with the at least one processor, causes the apparatus to determine the adjustable factor and quantize the side channel signal by being configured to:

select a plurality of adjustable factors from a predetermined set of factors in response to a difference between the determined respective masking threshold for each of the at least two channels of the stereophonic signal;

determine either an average of a quantization noise exceeding each respective masking threshold for each of the at least two channels of the stereophonic signal or a maximum of a quantization noise exceeding each respective masking threshold for the at least two channels of the stereophonic signal, wherein the determine of the average or maximum is performed for different combinations of the selected factors and of a plurality of values of at least one quantization parameter used in quantizations of the side channel signal; and select the combination resulting in a minimum of the determined averages or a minimum of the determined maxima for quantizing the side channel signal.

16. The apparatus according to claim 11, wherein the at least one memory and the computer program code configured to, with the at least one processor, further cause the apparatus to use the quantization in an algebraic code excited linear prediction loop.

17. The apparatus according to claim 11, wherein the audio signal comprises speech.

18. An apparatus comprising at least one processor and at least one memory including computer program code, the at least one memory and the computer program code configured to, with the at least one processor, cause the apparatus at least to:

determine a respective masking threshold for each of at least two channels of a stereophonic signal stored on the at least one memory;

determine either an average of a quantization noise exceeding each respective masking threshold for each of the at least two channels of the stereophonic signal or a maximum of a quantization noise exceeding each respective masking threshold for each of the at least two channels of the stereophonic signal, wherein the determining is performed for each of different combinations of values of a plurality of quantization parameters used in quantization of a side channel signal, wherein the side channel signal has been obtained by converting the stereophonic signal at least into a mid channel signal and the side channel signal;

select a combination of values of the different combination of values of the plurality of quantization parameters which results in a minimum of the determined averages or a minimum of the determined maxima, respectively;

quantize the mid channel signal and the side channel signal for transmission using the selected combination of values of the different combination of values of quantization parameters;

transmit at least the quantized mid channel signal and the side channel signal;

decode the quantized mid channel signal and the side channel signal;

reconstruct left and right channel signals based on the decoded mid channel signal and the decoded side channel signal; and present the decoded left and right channel audio signals to a user via a user interface.

19. The apparatus according to claim 18, wherein the at least one memory and the computer program code configured to, with the at least one processor, further cause the apparatus to use the quantization in an algebraic code excited linear prediction loop.

20. The apparatus according to claim 18, wherein the audio signal comprises speech.

* * * * *